(12) United States Patent  
Cooper

(10) Patent No.: US 8,248,059 B2  
(45) Date of Patent: Aug. 21, 2012

(54) ELECTRONIC TRANSFORMER MEASURING DEVICE HAVING SURFACE MOUNTING ASSEMBLY

(75) Inventor: David Michael Cooper, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 416 days.

(21) Appl. No.: 12/696,336

(22) Filed: Jan. 29, 2010

(65) Prior Publication Data

US 2010/0194375 A1 Aug. 5, 2010

Related U.S. Application Data

(60) Provisional application No. 61/148,844, filed on Jan. 30, 2009.

(51) Int. Cl.  
*G01R 31/02* (2006.01)

(52) U.S. Cl. .......................................... 324/142; 324/74

(58) Field of Classification Search .................. 324/142, 324/547, 117 R  
See application file for complete search history.

(56) References Cited

U.S. PATENT DOCUMENTS

| 5,057,769 | A | 10/1991 | Edwards | |
|---|---|---|---|---|
| 7,746,624 | B2 * | 6/2010 | Rispoli et al. | 361/623 |
| 2008/0106425 | A1 * | 5/2008 | Deaver et al. | 340/646 |

OTHER PUBLICATIONS

ERMCO, "Single Phase Pad Mounted Distribution Transformer," Sep. 2001, 4 pages.

* cited by examiner

*Primary Examiner* — Vicent Q Nguyen  
(74) *Attorney, Agent, or Firm* — Woodcock Washburn LLP

(57) ABSTRACT

A method and apparatus for mounting an electronic measuring device inside the housing a pad mount low voltage distribution power transformer are provided. The space inside a transformer enclosure cover contains the power input and output connections and cables. The electronic measuring device includes a surface mounting assembly that is configured to mount the measuring device at multiple locations of the housing.

20 Claims, 8 Drawing Sheets

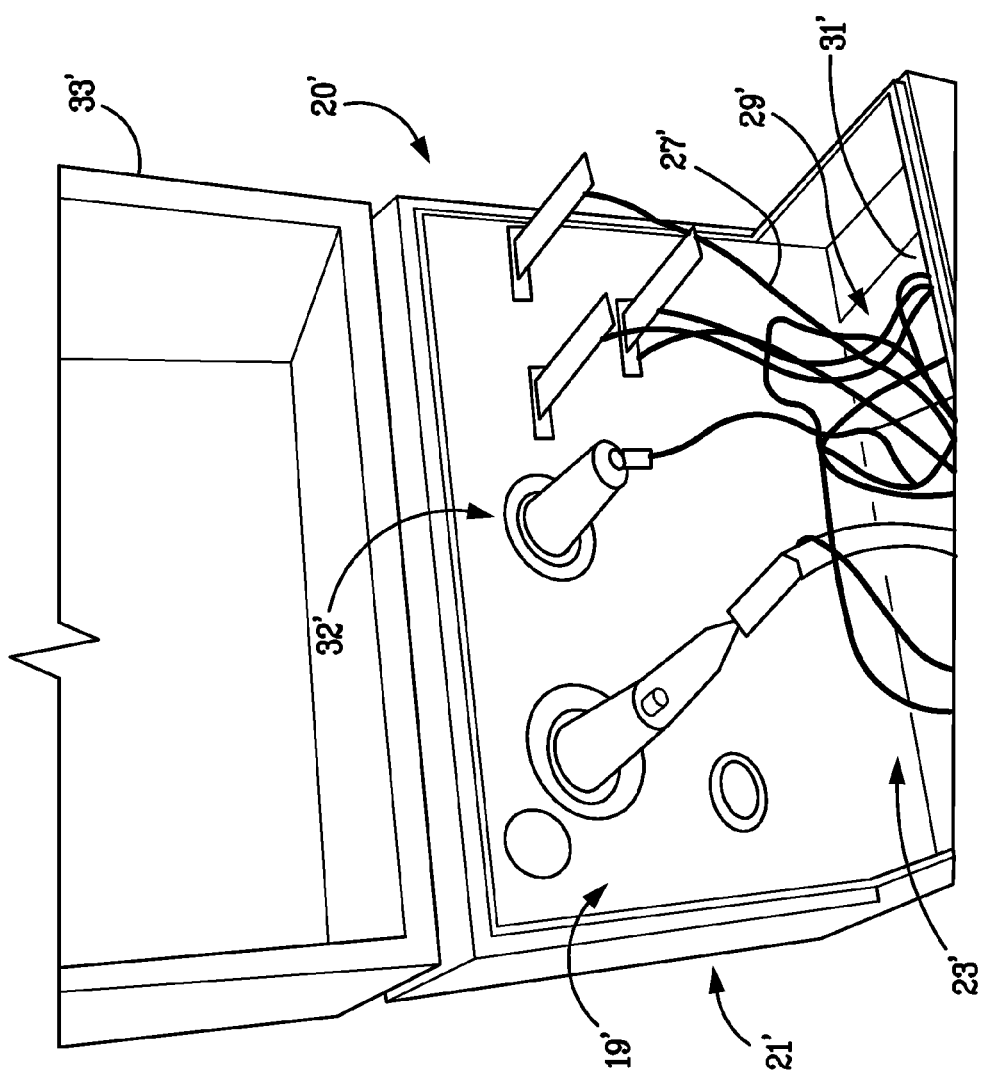

ELECTRONIC TRANSFORMER MEASURING DEVICE HAVING SURFACE MOUNTING ASSEMBLY

CROSS-REFERENCE TO RELATED APPLICATIONS

This claims priority to U.S. Provisional Patent Application Ser. No. 61/148,844, filed Jan. 30, 2009, the disclosure of which is hereby incorporated by reference as if set forth in its entirety herein.

BACKGROUND

Referring to FIGS. 1A-B, a conventional low-voltage pad-mount distribution transformer 20 in a meter network. The transformer 20 includes a housing 21 that defines a wire-retaining void 23 configured to retain the terminal ends 25 of a plurality of output load wires 27. Typically, the load wires 27 are buried in the ground 31, and the terminal ends 25 extend up through the ground and into an open base 29 in the housing 21 that leads to the internal void 23. The transformer 20 is illustrated as a single-phase power distribution transformer, though it should be appreciated that the transformer could alternatively be provided as a polyphase transformer having, for instance, three phases. The housing 21 further includes a cover 33 that can be removed or opened so as to selectively provide access to the void 23 and the contained electrical components.

The transformer 20 includes a plurality of output terminal assemblies 32 mounted onto an inner wall of the housing 21. Each output terminal assembly 32 includes an electrically insulating bushing mounting flange 35, an electrically insulating bushing 22, an electrically conductive output stud 28, and an electrically conductive wiring terminal 30 that receives a plurality of the output load wires 27. It should be appreciated that the flange 35 can be integrally connected to the bushing 22, or can be discretely connected to the bushing 22. It should further be appreciated that the electrically conductive components of the terminal assemblies 32 are current carrying conductors, and thus also current carrying members. Furthermore, the insulative components of the terminal assemblies 32 that carry a conductor (such as the bushing 22) while not conductive themselves, are current carrying members that carry the current of the current carrying conductors.

In accordance with the illustrated embodiment, the panel mount 35 can be bolted onto, or otherwise attached to or supported by the housing 21. The insulated bushing 22 can be cylindrical or alternatively shaped, and projects out from the panel mount 35 into the wire-retaining void 23. The electrically conductive output stud 28 defines a proximal end extending through the bushing 22 and panel mount 35, and connects to a high voltage source. The output stud 28 further defines a distal end opposite the proximal end that extends into the conductive wiring terminal 30. An exposed portion 41 of the output shaft 28 thus extends through a gap 38 disposed between the bushing 22 and the wiring terminal 30.

The wiring terminal 30 includes a plurality of output stud locks 34 that can include a set screw 39 or other suitable structure sufficient to retain the output stud 28 in the terminal 30 and provide a secure electrical connection between the wiring terminal 30 and the output stud 28. The wiring terminal 30 further includes a plurality of wire mounting apertures 36 that receive the terminal ends 25 of the wires 27. The wiring terminal 30 further includes a plurality of clamps 37 that can include a set screw or other suitable structure sufficient to retain the terminal ends 25 in the wire mounting apertures 36, thereby providing a secure electrical connection between the wires 27 and the wiring terminal 30. Accordingly, the output stud 28 is placed in electrical communication with the output load wires 27, which provide electrical power to a plurality of local nodes. It is appreciated that the output terminal assembly 32 is illustrated in accordance with one embodiment, and that numerous alternative configurations are known. The embodiments described herein are intended to be used in combination with all such alternative embodiments.

It is desirable to measure the electrical power flowing through each output terminal assembly 32, for instance to reconcile the power usage as measured at the nodes with the power applied at the transformer. Conventional integral power measurement assemblies include a measurement apparatus that can be attached to any current-carrying members of any or all of the output terminal assemblies. One such conventional power measurement assembly is described in U.S. Pat. No. 5,057,769. The measurement apparatus typically includes a current sensing member and a voltage sensing member mounted onto a card, such as a printed circuit board. The printed circuit board also carries a microprocessor that receives signals from the current and voltage sensing members, and determines the power of the terminal assembly 32 or transformer 20. Thus, it can be said that the microprocessor is carried by the same integral structure that carries the current and voltage measuring members.

The physical features of the transformer 20 inside the void 23 are unfortunately not controlled by ANSI standards and therefore vary significantly between manufacturers. While ANSI standards can specify the output terminal arrangements and many other details of the transformer design, the transformer manufacturer still has significant latitude in locating the various transformer apparatus that is disposed inside the void 23.

For instance, FIG. 1A illustrates a pad mount low voltage distribution power transformer 20 having an ANSI Type 1 output terminal arrangement 19, while FIG. 1C illustrates a second pad mount low voltage distribution power transformer 20' having an ANSI Type 2 output arrangement 19'. While ANSI may specify the output terminal arrangements along with other details of the transformer design, the transformer manufacturer still has significant latitude in locating the various transformer features inside the cover area. Accordingly, the wires, inputs and outputs can be placed at various locations within the void among a wide variety of transformer.

Unfortunately, because usable space that can accommodate a conventional integral power measurement assembly may be located in different places inside the void 23, installing conventional integrally constructed measurement systems in the transformer housings 21 thus poses a significant challenge. In particular, in some instances the usable spaces is located on one side of a transformer housing 21, while in other cases the usable space exist on the other side of the transformer housing 21 or near the upper end of the cover 33.

What is therefore desired is a reliable method and apparatus for installing a power measurement system in a transformer housing.

SUMMARY

In accordance with one aspect, a remote power measurement assembly is configured to calculate power output of a pad mount low voltage distribution power transformer of the type including a transformer housing defining an interior void, and at least one terminal assembly that includes an output stud extending into a wiring terminal, and a plurality of output load wires connected to the wiring terminal. The remote power measurement assembly includes a current sensor and an electronic measuring device operatively coupled to the current sensor. The current sensor is configured to be mounted onto a current carrying member of the terminal assembly, such that the current sensor senses a current level of the current carrying member, and outputs a signal reflecting the sensed current level. The electronic measuring device is configured to receive the output signal, such that the electronic measuring device is movable with respect to the current sensor. The electronic measuring device including a measuring device housing, and a surface mounting assembly that includes at least one magnet coupled to the measuring device housing, wherein the magnet is configured to magnetically mount the measuring device housing onto an inner surface of the transformer housing.

BRIEF DESCRIPTION OF THE DRAWINGS

FIG. 1C is a perspective view of a pad mount low voltage distribution power transformer with a respective enclosure access cover opened to illustrate an ANSI Type 2 output terminal arrangement;

DETAILED DESCRIPTION

Figure 1A:
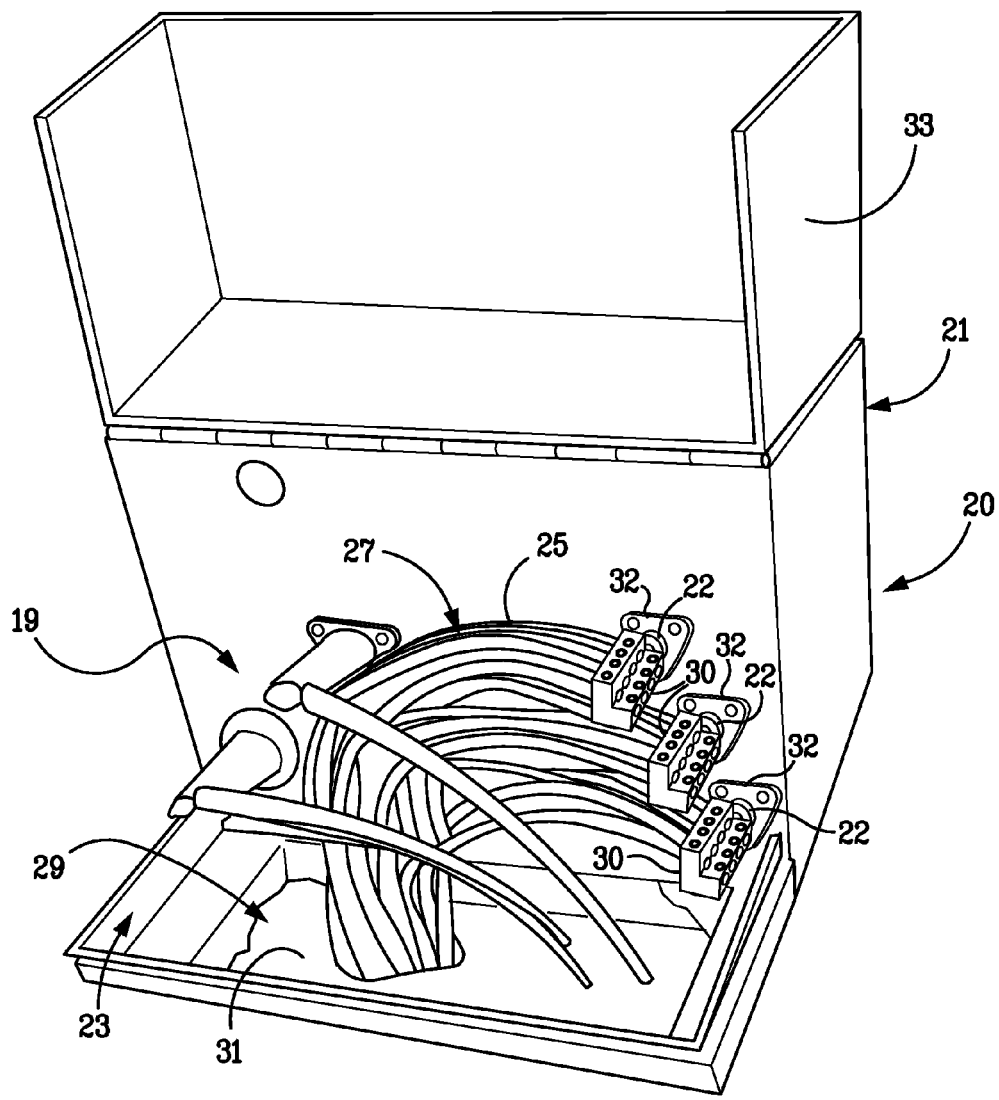
FIG. 1A is a perspective view of a conventional pad mount low voltage distribution power transformer with a respective enclosure access cover opened to illustrate an ANSI Type 1 output terminal arrangement.
Figure 1B:
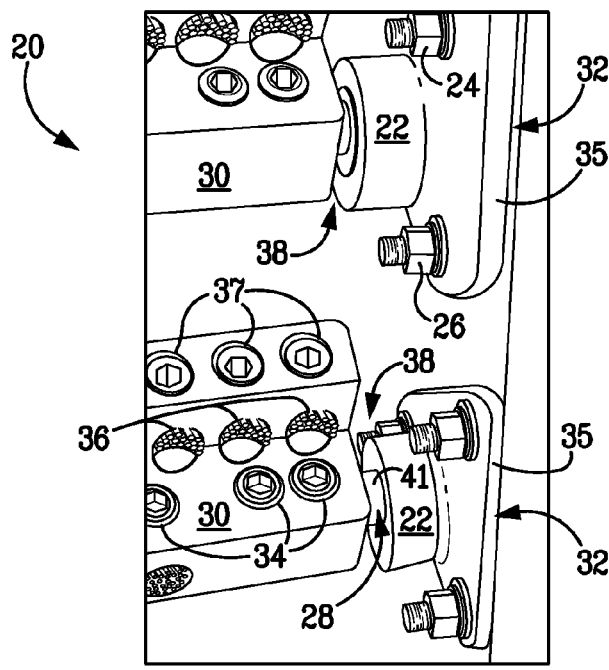
FIG. 1B is a perspective view of an output terminal assembly of the conventional low-voltage pad-mount distribution transformer illustrated in FIG. 1A.
Figure 2A:
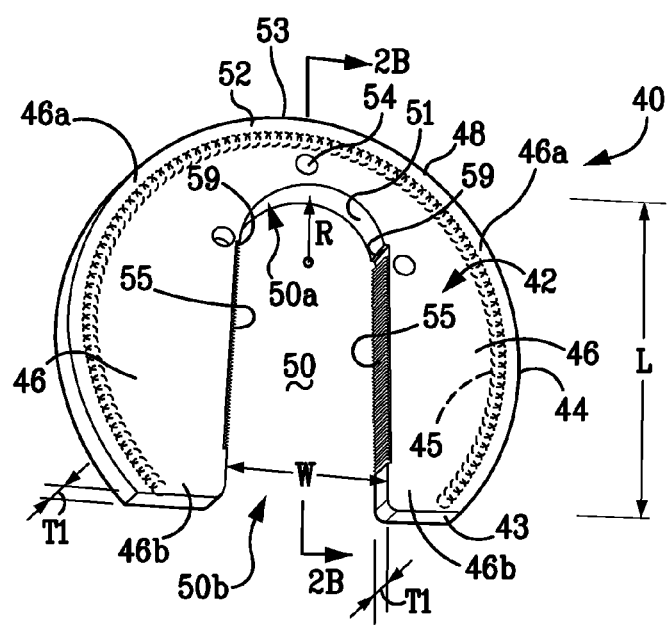
FIG. 2A is a perspective view of an open-aperture current sensor constructed in accordance with one embodiment.
Figure 2B:
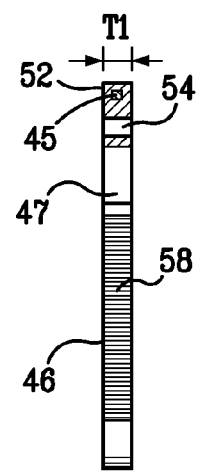
FIG. 2B is a sectional side elevation view of the sensor illustrated in FIG. 2A, taken along line 2B-2B.
Figure 3:
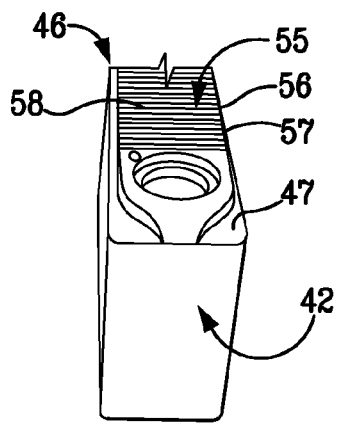
FIG. 3 is a perspective view of a portion of the current sensor illustrated in FIGS. 2A-B, showing an engagement member.

Referring to FIGS. 2A-B and 3, an open-aperture AC current sensor 40 is provided as a Rogowski-based current sensor. Accordingly, the current sensor 40 includes an arc-shaped or C-shaped substantially planar insulating body 42. The insulating body 42 can be formed from any suitable electrically insulative material, such as plastic. The insulating body 42 defines a pair of opposing planar surfaces 43 and 44, and a thickness T1 between the outer surfaces of less than approximately 0.5 inch. The body 42 defines an outer surface 48 that extends in an arc, for instance greater than 180°, such as approximately 270°. It should however be appreciated that the outer surface 48 can define any suitable alternative shape as desired.

The body 42 further defines a pair of arms 46 defining corresponding proximal ends 46a, and a bridge 52 that is connected between proximal ends 46a of the arms 46. Each arm 46 further defines a distal terminal end 46b disposed opposite the proximal end 46a. It should thus be appreciated that various structure of the sensor 40 is described herein as extending in a proximal or a distal direction, and that these directions are used with reference to the proximal 46a and distal 46b ends of the arms 46.

Each arm 46 defines an inner surface 47, and a corresponding opposing outer surface 49. Likewise, the bridge 52 defines an inner surface 51 and a corresponding outer surface 53. The outer surfaces 49 and 53, in combination, define the outer surface 48 of the body 42. The inner surfaces 47 of the arms 46 extend substantially parallel to each other in accordance with the illustrated embodiment, though the inner surfaces 47 can define any suitable shape as desired. The inner surface 51 of the bridge 52 is connected between the proximal ends of the inner surfaces 47, and is illustrated as curved defining radius of curvature R. It should be appreciated, however, that the inner surface 51 can define any alternative shape as desired suitable to join the proximal ends 46a of the arms 46 at their inner surfaces 47.

The current sensor 40 further includes a slot 50 extending into the insulating body 42. The slot 50 is defined by the inner surface 51 of the bridge 52 and the opposing inner surfaces 47 of each arm 46 of the body 42. The inner surfaces 47 are spaced apart a distance that defines a width W of the slot 50. The slot 50 defines a proximal end 50a defined by the inner surface 51, an opposing open distal end 50b, such that the distal ends 46b of each arm 46 are separated by the distal end 50b of the slot 50. The slot 50 defines a length L disposed between the proximal end distal ends 50a-b.

In this regard, it should be appreciated that the width W and length L of the slot 50 are suitable such that the slot 50 at least partially defines a receptacle 87 or mounting space (see FIG. 5) configured to receive an electrical current carrying member. For instance, it should be appreciated that the slot 50 can directly receive the conductor, or can alternatively receive an insulating body that contains the conductor. The distal terminal ends 46b define a leading end of the current sensor 40 when the sensor 40 is mounted onto the electrical component, such that the electrical component is received between the opposing arms 46 in the slot 50. For instance, the slot 50 is configured to receive a conductor stud, such as the conductive output stud 28 as described above. Furthermore, width W and length L of the slot 50 can be dimensioned so as to receive the insulating bushing 22 that contains the conductive output stud 28. The slot 50 can further be dimensioned to receive certain conventional wiring terminals that electrically connect output load wires such as the output load wires 27 described above to a conductor stud, such as the conductor stud 28 as described above. The current sensor 40 can define at least one aperture 54 extending through the insulating body 42, which can receive clamps or other engagement structure suitable to mount the sensor 40 to a support structure as desired.

The current sensor 40 includes an electrically conductive coil 45 that is embedded in the insulating body 42, such that the coil 45 is contained between the planar surfaces 43 and 44.

Thus, the coil 45 has a non-magnetic low inductance core, as opposed to a conventional iron core. The coil 45 generally follows the outer periphery of the sensor body 42. When the slot 50 receives the electrical conductor whose current is to be measured, a voltage is induced in the conductive coil 45 that is proportional to the rate of magnetic flux change around the received conductor. The magnetic flux is, in turn, is proportional to the instantaneous current flowing through the conductor. It should be appreciated that the output of the conductive coil is integrated so that the voltage output is directly proportional to the current of the conductor. Accordingly, as described below with respect to FIG. 6, the current sensor 40 can provide an output voltage signal that is indicative of the current flowing through the conductor disposed in the slot 50. The output voltage signal from the sensor 40 of each terminal assembly can be received by an electronic measuring device 102 that calculates the power of the transformer 20, and thus also can calculate total energy consumed by a transformer load. The current sensor 40 thus operates under the general principles of a Rogowski coil, which completely surrounds the electrical conductor whose current flow is to be measured. Accordingly, the coil 45 can be referred to as a modified Rogowski coil that does not completely surround the received electrical conductor, but rather has an open terminal end that receives the conductor whose current is to be measured. Modified Rogowski coils are known in the art, for instance as described in U.S. Pat. No. 5,057,769.

Referring also to FIG. 3, the current sensor body 42 carries a first engagement member 55 that is configured to engage a complementary engagement member of a retainer member 60 (see FIG. 4), for instance when mounting the current sensor onto the electrical conductor. In accordance with the illustrated embodiment, the engagement member 55 is provided as a rack 56 of projections that define one or more teeth 58. The rack 56 extends along a direction between the proximal and distal ends 46a-b of a corresponding one of the inner surfaces 47. As illustrated, a rack 56 extends along both inner surfaces 47 in a direction parallel to the planar surfaces 43 and 44. Each rack 56 includes a plurality of teeth 58 that project into the slot 50 from the inner surfaces 47, and are elongate along a direction between the planar surfaces 43 and 44. Each rack 56 further defines a plurality of interstices 57 disposed between adjacent teeth 58. In accordance with the illustrated embodiment, the teeth 58 are oriented substantially normal to the planar surfaces 43 and 44. It should be appreciated that the racks 56 and corresponding teeth 58 can be oriented and shaped as desired.

The current sensor body 42 further includes a stop protrusion 59 extending into the slot 50 from the inner surfaces 47 at a location adjacent and proximal to the proximal end of the corresponding rack 56. The stop protrusion 59 extends into the slot 50 a distance greater than the teeth 58. As a result, the retainer 60 can be sized for insertion into the slot 50 along a proximal direction so as to pass between the racks 56 and abut the stop protrusions 59, thereby limiting the insertion of the retainer 60 into the slot 50 as will now be described.

Figure 4:
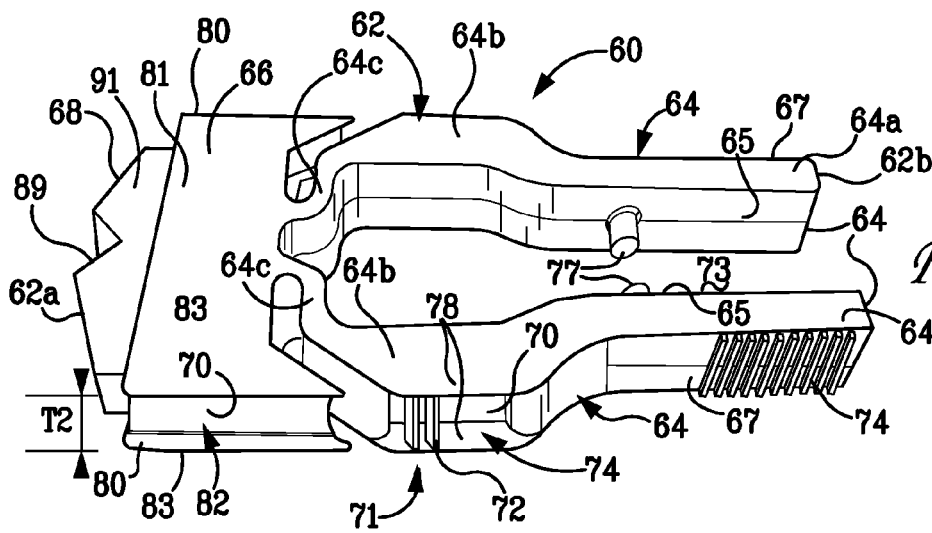
FIG. 4 is a perspective view of a retaining member including an engagement member configured to mate with the engagement member of the current sensor illustrated in FIGS. 2A-B.
Figure 5:
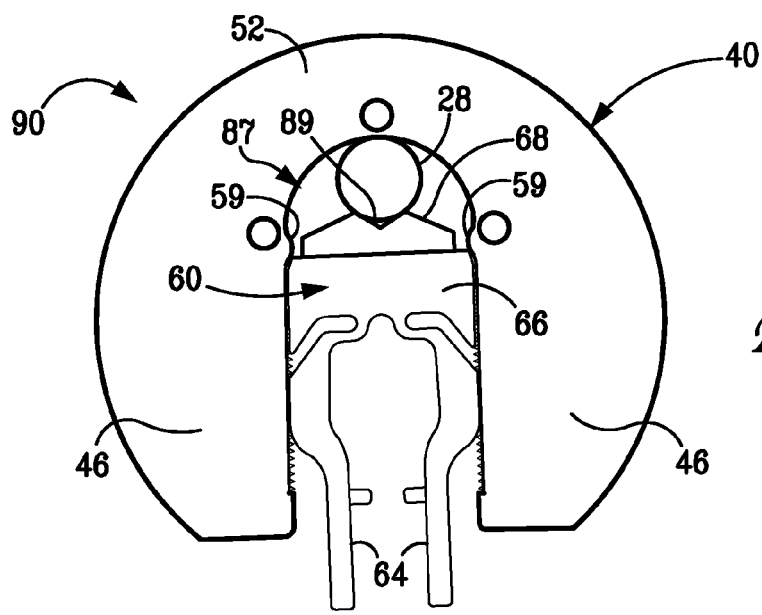
FIG. 5 is a perspective view of the retaining member illustrated in FIG. 4 mated with the current sensor illustrated in FIG. 4.

In particular, referring now to FIGS. 4-5, the retainer member 60 includes a retainer body 62 defining a proximal end 62a and an opposing distal end 62b. The retainer member body 62 can have a thickness T2 that is less than the size of the gap 38 disposed between the bushing 22 and the wiring terminal 30, such as approximately 0.5 inches. The body 62 can be formed from any suitable electrically insulative material, such as plastic. As will be appreciated, the proximal end 62a defines an insertion end configured to be inserted into the slot 50 of the current sensor 40 and cooperate with the sensor body 42 to retain current carrying member, such as a conductor, in the slot 50, and the distal end 62b defines a handle end of the retainer member 60 configured to be manipulated by a user. It should be appreciated that various structure of the retainer member 60 is described herein as extending in a proximal or a distal direction as indicated by the proximal and distal ends of the body 62.

The retainer body 62 includes a pair of opposing arms 64 configured to manipulate the retainer member, a retainer wall 66 extending proximally from the arms 64 and configured to engage the arms 46 of the current sensor, and a pad 68 extending proximally from the retainer wall 66 and configured to cooperate with the current sensor body 42 to retain the conductor in the slot 50. The pad 68 can cooperate with the sensor body 42 to define a receptacle 87 that retains a current carrying member whose current is to be sensed by the current sensor 40.

Each arm 64 defines an inner surface 65 and an opposing outer surface 67. The inner surfaces 65 of the opposing arms 64 are separated by a gap 73. Each arm 64 defines a distal region 64a that carries a textured grip 74, an outwardly flared central region 64b that carries a second engagement member 71 configured to mate with the engagement member 55 of the current sensor 40, and an inwardly extending proximal region 64c that is connected to the retainer wall 66. The proximal regions 64c provide hinges that have a reduced thickness with respect to the central region 64b, such that the central 64b and distal 64a regions of each arm 64 can flex about the corresponding proximal region 64c.

The grip 74 projects outward from the outer surface 65 of the distal region 64a of each arm 64, and is configured to be engaged by a user to allow easy manipulation of the arms 64 and the retainer 60. Each arm 64 further includes a stop member in the form of a pin 77 that projects inwardly from the inner surface 65 of the proximal region 64c. When the arms 64 are in a first or neutral relaxed configuration, the terminal ends of the stop pins 77 are spaced apart, and configured to abut each other when the arms 64 are flexed inwardly toward each other a predetermined distance, so as to limit the inward deflection of the arms 64.

The retainer member 60 further includes an engagement member 71 including at least one or a plurality of teeth 72 carried by the outer surface 67 of the central region 64b. The teeth 72 are configured to mate and interlock with the one or more teeth 58 extending from the inner surface 47. In particular, the central region 64b of each arm 64 includes a guide 70 defined by a pair of spaced walls 78 defining a channel 79 therebetween. The channel 79 is sized to receive the rack 56. The teeth 72 are disposed in the channel 79, and can be angled distally along a direction from the inner surface 65 of the arm 64 to the outer surface 67. Accordingly, the one or more teeth 72 are configured to cam over the complementary one or more teeth 58 of the current sensor 40 when the retainer member 60 is inserted in the slot 50, and engage the teeth 58 with respect to inadvertent removal of the retainer member 60 from the slot 50.

While the current sensor 40 and retainer member 60 are illustrated and described herein as including engagement members 55 and 71 in the form of mating teeth 58 and 72, it should be appreciated that the current sensor 40 and retainer member 60 could include any suitable alternatively engagement structure located anywhere on the respective bodies 42 and 62 such that the retainer member 60 is configured to reliably connect to the current sensor 40 so as to engage a conductor in the manner described herein.

The retainer wall 66 is connected to and carries the arms 64. In particular, the retainer wall 66 extends proximally from the proximal regions 64c of the arms 64, and defines a retainer wall body 81 presenting a pair of opposing outer surfaces 80. The retainer wall 66 defines a channel 82 projecting into each outer surface 80, so as to define a pair of spaced walls 83 sized to receive the rack 56 therebetween. If the rack 56 extends between the opposing planar surfaces 43 and 44, then the channels 82 can receive the arms 46 therein. The channel 82 has a depth that is greater than the distance that the teeth 58 project into the slot 50, such that the channel 82 can slidably receive the rack 56. Because the channels 82 are aligned with the channel 79 of the arms 64, the channels 82 provide a guide that aligns the teeth 72 of the retainer member 60 with the teeth 58 of the current sensor 40.

The pad 68 extends proximally from the proximal end of the retainer wall 66, and can be made from any suitable insulative material. As illustrated, the pad 68 is compliant, and made from rubber or any suitable alternative material. The pad 68 includes a pad body 91 that is inwardly recessed with respect to the outer surfaces 80 of the retainer wall 66. The pad body 68 is dimensioned to fit inside the slot 50 while avoiding interference with the inner surfaces 47 and 51, and the stop protrusions 59. The pad body 91 defines a conductor-engaging proximal end 84 that defines an engagement surface 85 configured to engage the conductive member whose current is to be measured. The pad 68 defines a notch 89, which can be v-shaped as illustrated, projecting centrally into the engagement surface 85. The notch 89, in combination with the bridge 53, is configured to at least capture the current carrying member of the transformer 20 in the slot 50.

A current sensing assembly 90 thus includes the current sensor 40 and the retainer member 60 that can be joined to the current sensor 40 so as to measure the current flowing through a conductor retained in the current sensing assembly. In particular, during operation, the sensor body 42 is placed over the conductor whose current is to be measured, such as the output stud 28 or bushing 22, such that the conductor is disposed in the slot 50 having an open distal end 50b. Next, the retainer wall 66 of the retainer member 60 is aligned with the slot 50, such that the channel 82 is aligned to receive the racks 56 and/or the arms 46.

The channel 82 is then translated proximally along the inner surfaces 47, thereby causing the retainer wall to close the distal end 50b of the slot so as to define a receptacle 87. An inwardly biasing force can be applied to the arms 64 of the retainer member 60 that causes the arms 64 to deflect in a first direction, such as inwardly toward each other, from the first relaxed configuration to a second compressed or unlocked configuration, whereby the opposing teeth 72 are disposed inward with respect to the teeth 52. The retaining member 60 is then further translated into the slot 50 until the pad 68 body abuts the conductive member, illustrated as the output stud 28 in FIG. 5, thereby retaining the output stud 28 in a receptacle 87 disposed between the engagement surface 85 of the pad 68 and the inner surface 51 of the bridge 52.

Once the conductor 28 is secured in the receptacle 87, the applied biasing force can then be removed. The proximal regions 64c of the arms apply a spring force to the central and distal regions 64b and 64a, thereby causing central portions 64 of each arm 64 to deflect in a second direction opposite the first direction (e.g., outwardly away from each other) to a third locked configuration, whereby the teeth 72 are releasably locked in the interstices 57 between the teeth 52, thereby releasably locking the engagement members 55 and 71. Once the current sensing assembly 90 is mounted onto the conductor 28 and thus configured for long-term current sensing, the cover 33 can be closed for normal meter operation.

When it is desired to remove the current sensing assembly 90 from the conductor 28, the inwardly biasing force is applied to the arms 64, thereby causing the arms to flex and deflect from their third locked position to their second unlocked position, which causes the engagement members 55 and 71 to disengage, thereby allowing the retainer member 60 to translate distally out of the slot 50. The current sensor 40 can then be removed from the conductor 28. In this regard, it should be appreciated that the arms 64 provide an actuator that causes the locking member 71 to engage and disengage the locking member 55. While the arms 64 are constructed to provide a biasing spring force as illustrated, the retainer member 60 could alternatively or additionally include one or more discrete biasing members, such as a spring member, that can bias the arms 64 into their locked positions in the manner described above.

Figure 6:
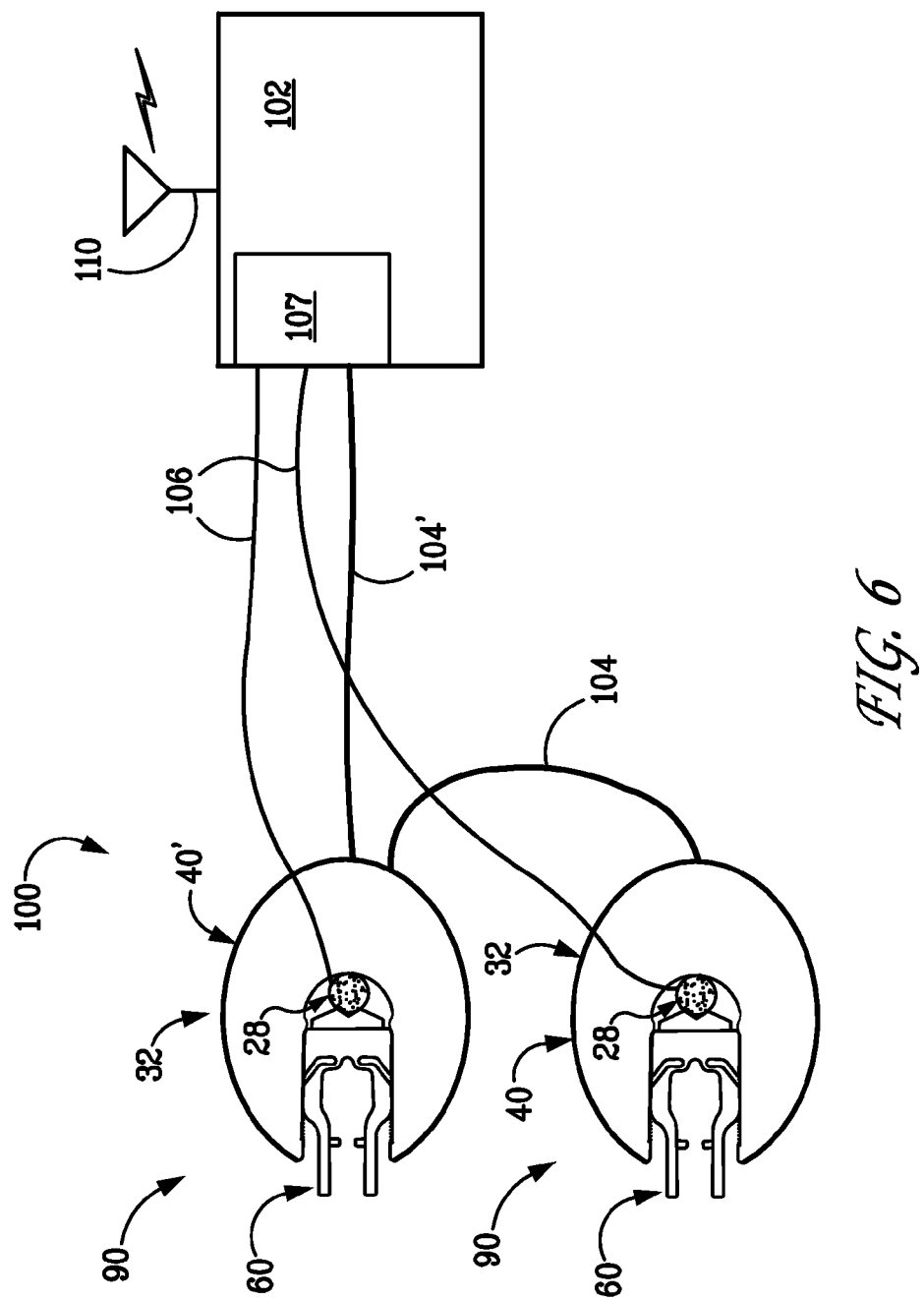
FIG. 6 is a schematic view of a remote power measurement assembly constructed in accordance with one embodiment.
Figure 7:
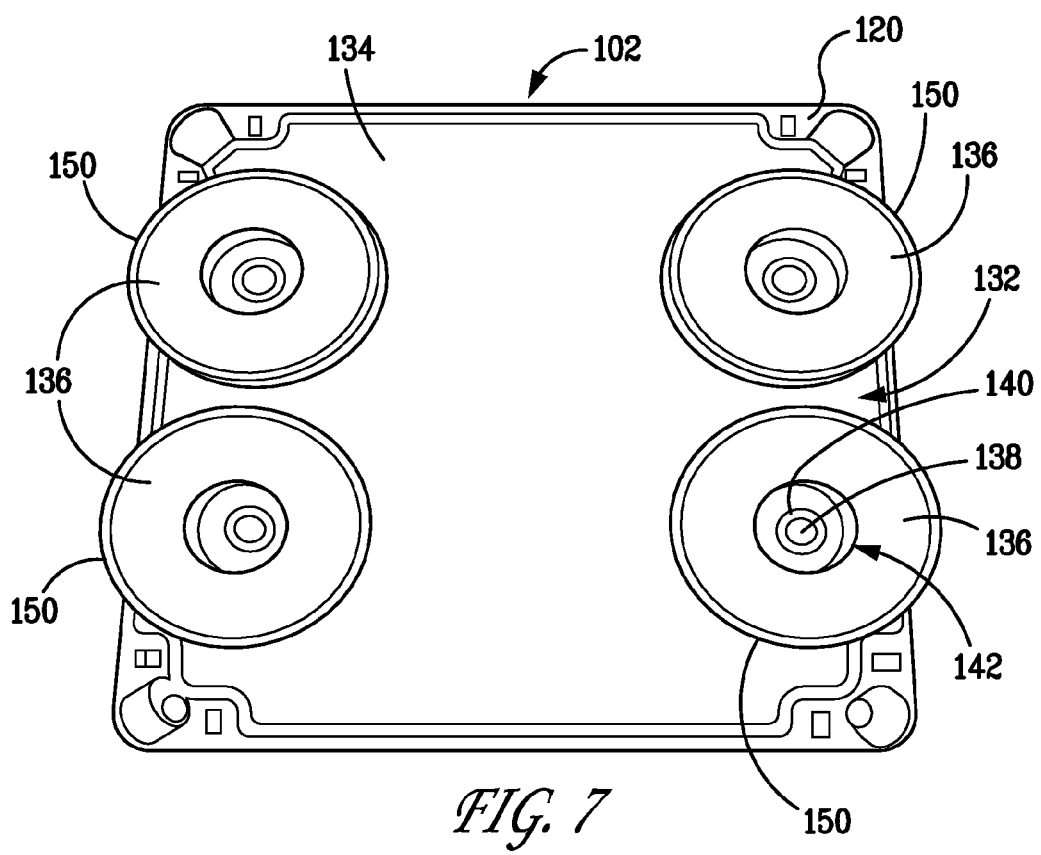
FIG. 7 is a bottom plan view of an electronic measuring device including a surface mounting assembly constructed in accordance with an example embodiment.
Figure 8:
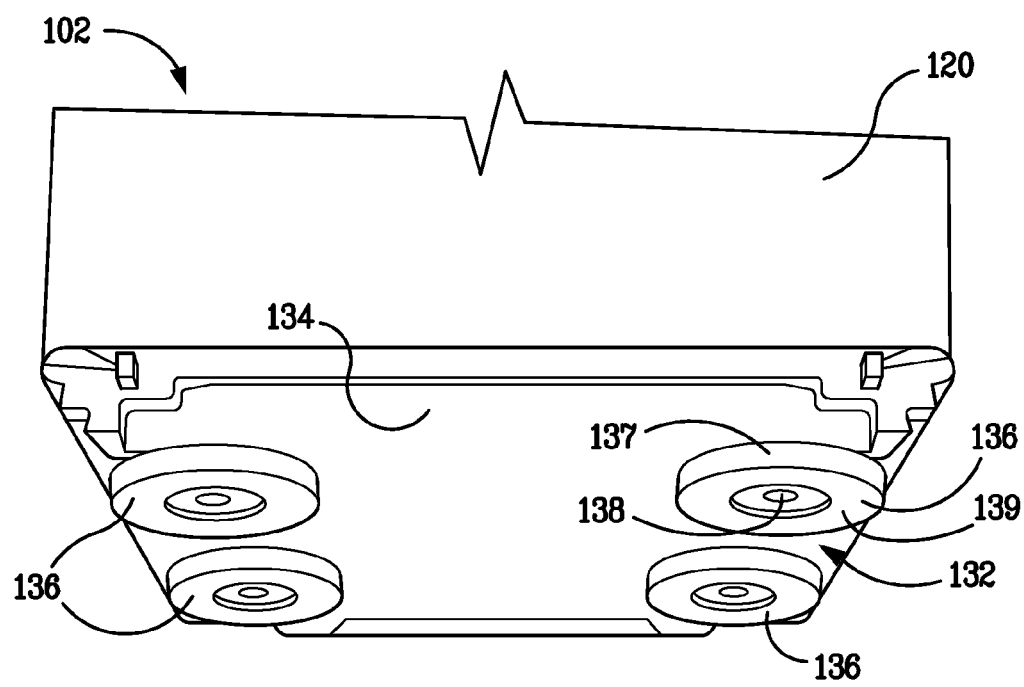
FIG. 8 is a perspective view of the electronic measuring device illustrated in FIG. 7.
Figure 9:
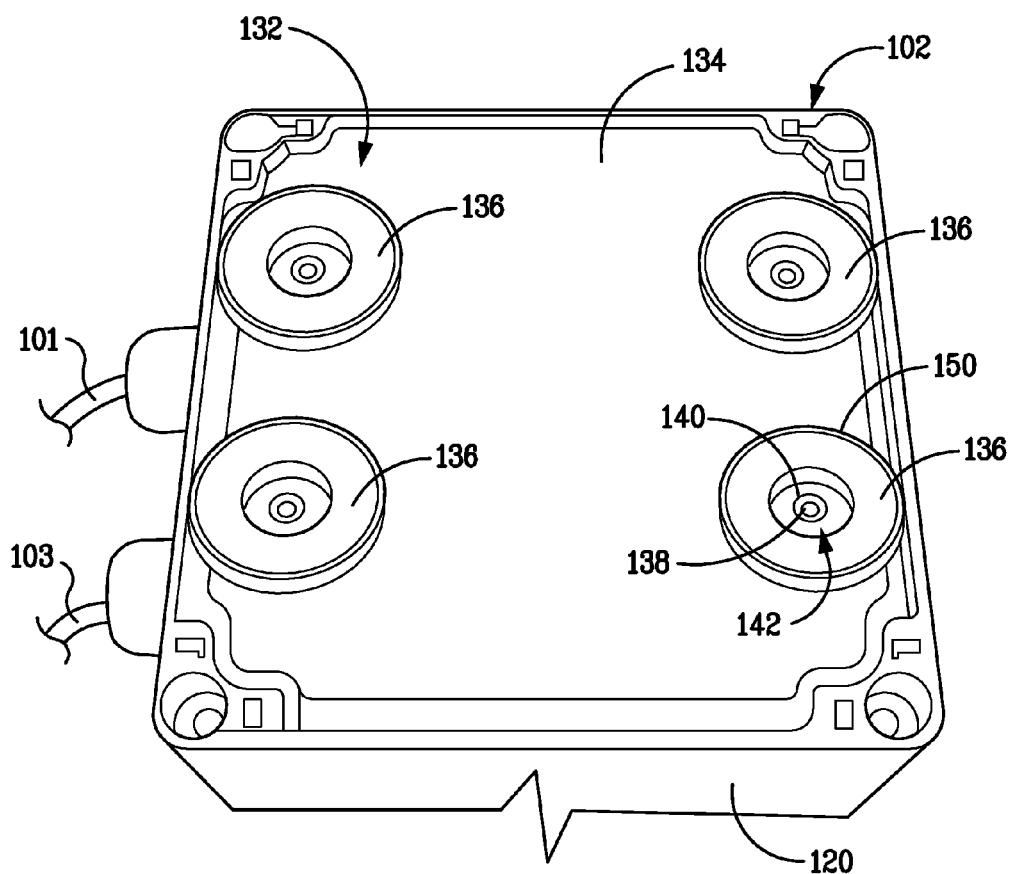
FIG. 9 is a bottom perspective view of the electronic measuring device similar to FIG. 8.

Referring now to FIG. 6, a power measurement assembly 100 includes a electronic measuring device 102 configured to receive signal of a master current sensor 40' and a slave current sensor 40, each constructed as described above. It is appreciated in the art that the power output of a single phase power distribution transformer 20 can be measured using the difference of two line currents and a line to line voltage. Alternatively, it should be appreciated that the electronic measuring device 102 could alternatively be electrically connected to the phase outputs of a polyphase distribution transformer.

In accordance with the illustrated embodiment, the current sensing assembly 90 can be mounted onto a conductor of each of the two line current terminal assemblies 32, so that each sensor 40 generates a voltage proportional to its line current as described above. The difference of the signals of the sensors 40 is indicative of the total output current flowing through the transformer 20. The power measurement assembly 100 can include a first conductive output lead 104 that is electrically connected from the slave current sensor 40 at one end, to the master current sensor 40' at its opposing end. The master current sensor 40 integrates the difference of the voltage signal generated by the slave current sensor 40 and the voltage signal generated by the master current sensor 40'. The power measurement assembly 100 can include a second conductive output lead 140' that is electrically connected from the master current sensor 40' to the electronic measuring device 102 at its opposing end. The second conductive output lead 104' thus transmits a voltage signal proportional to the difference of the two terminal currents. The power measurement assembly 100 further includes voltage leads 106 that can each be electrically connected to one of the terminal assemblies 32 at one end, and to the electronic measuring device 102 at their opposing end. The voltage leads 106 provide the line voltage of the corresponding terminal assembly 32 to the electronic measuring device 102. The electronic measuring device 102 includes a power measurement circuit that receives the line voltages from the leads 106, along with the electronic signals from the conductive output lead 104', and can thus calculate the power output of the transformer. The electronic measuring device 102 can further include a radio transmitter 110 that wirelessly communicates the resulting energy measurement date to a data collection system.

Accordingly, the electronic measuring device 102 is movable with respect to the sensing assembly 90, and can thus be positioned at numerous locations on the housing 21 when the current sensing assembly 90 is mounted onto one or more output terminal assemblies 32. Because the electronic measuring device 102 is not integrally connected with the sensing assembly 90, the measuring device 102 can be described as a remote electronic measuring device.

Referring to FIGS. 1-2 and 7-10B, because the electronic measuring device 102 is remote and thus movable with respect to the current sensor 40, the device 102 is configured to be inserted and mounted in the internal void 23 at different locations on the transformer housing 21. The electronic measuring device 102 includes a surface mounting assembly 132 that is configured to be mounted in the interior of the transformer 20 at any desired location. It should thus be appreciated that the wires 104/104' and 106 can have a length sufficient such that the electronic measuring device 102 can be positioned anywhere on the housing 21 as permitted by the accessibility to the various locations of housing 21 by the internal components of the transformer 20. The mounting assembly 132 can be provided at low cost, provides mounting flexibility at various locations within the transformer 20, and is easy to install in the transformer 20 and easy to remove from the transformer 20.

In the illustrated embodiment, the measuring device 102 includes a housing 120 that contains a power measurement circuit 107 suitable to calculate the power and wirelessly transmit the calculated power to a central data collector via the radio transmitter 110 at 900 MHz. The housing 120 defines a support surface 134 configured to interface with the transformer housing 21, and the surface mounting assembly 132 is carried by the support surface 134. The housing 21 is made of a metallic material, such as steel or any suitable magnetically conductive material.

In accordance with the illustrated embodiment, the surface mounting assembly 132 includes one or more magnets 136 mounted onto or otherwise supported or retained by the support surface 134. Thus, each magnet defines an inner surface 137 that faces or abuts the support surface 134 of the housing 120, and an opposing outer surface 139 that is configured to face, and operatively interface with, the transformer housing 21. The magnets 136 may be arranged in an array, for example one at each corner of the device. In one example embodiment, four magnets are configured in an approximately rectangular arrangement on the rear surface of a square device. In other embodiments of the device, a larger magnet may be used, while in other embodiments, 2, or 3 or 8, or any other positive integer number of magnets may be used in an array format that may define a rectangular or any other desired orientation, such as a triangle, or the shape of any other polygon, or they may even be randomly distributed on a surface of the device.

While multiple magnets 136 are all of approximately the same shape and size in the illustrated embodiment, it should be appreciated that magnets of different shapes and sizes could alternatively or additionally be affixed to the support surface 134.

One or more of the magnets 136, when viewed facing the support surface 134, may be circular or donut shaped, or may define any suitable alternative shape including but not limited to, square, rectangular, elliptical, trapezoidal, triangular, semicircular, half moon or U shaped, pentagonal, hexagonal, octagonal, any other polygon or of an amorphous shape or the like. The magnets may or may not have holes in them of any shape as well, such as, for example, a donut, square in square, circle in square, square in circle, a polygon in any shape, and the like.

The magnets 136 may be of any thickness suitable for creating a magnetic force sufficient to mount the device to a transformer box such that the device will remain mounted during the normal course of operation. In one example embodiment, the magnets 136 are mounted onto one support surface 134 of the housing 120. In other embodiments, the magnets 136 can be mounted onto a plurality of adjacent perpendicular support surfaces of the housing 120 such that the magnets 136 are configured to be mounted onto complementary adjacent perpendicular surfaces of the transformer housing 21, for instance when it is desired to mount the electronic measuring device 102 in a corner of the housing 21. For example, the magnets 136 may be made from any suitable material, such as any suitable metal such as steel, a rare earth material, or any composite material such as ceramic which is relatively inexpensive. Ceramic magnets of the type used herein are commercially available.

The magnets 136 may be configured to provide any desired force sufficient to affix them to an inner housing surface of a pad mounted low voltage distribution power transformer. For example, each magnet 136 may have a holding force in a range having a lower end that can include and be between about 10 pounds to 200 pounds, though it should be appreciated that any suitable magnet 136 is contemplated. In highly particular embodiments, the magnets 136 provide a holding force that reliably retains the electronic measuring device 102 on the transformer housing 21 when the cover 33 is closed, but sufficiently low to allow the electronic measuring device 102 to be movable within the transformer housing 21 during installation. Accordingly, the magnets 136 can be mounted onto the transformer housing 21 non-invasively, meaning that holes are not required to be drilled into the housing 21 in order to mount the electronic measuring device 102 onto the transformer housing 21, thereby reducing the likelihood that weather elements, such as water, can leak into the housing 21. Furthermore, the electronic measuring device 102 can be mounted into an upper surface of the transformer housing spaced above the ground such that water levels that may amass in the housing 21 from the ground 31 are unlikely to reach the height of the measuring device 102.

In one embodiment, the magnets 136 are affixed to the support surface 134, which includes a direct connection of the magnets 136 to the support surface 134 as well as an indirect connection of the magnets 136 to the support surface 134 via one or more intervening structures or surfaces. Furthermore, the magnets 136 are configured to affix to the metal transformer housing 21, either directly or via one or more intervening structures or surfaces. For example, magnets 136 may be situated adjacent to a magnetically conductive flux return housing 150, which may in turn be situated adjacent to the mounting surface 134 of the measurement device 102. It should further be appreciated that the magnets 136 may be affixed to, or supported by, any surface of the device 102, including the support surface 134 as illustrated, or any alternative surface of the device housing 120. In accordance with the illustrated embodiment, four magnets 136 are attached to the support surface 134 using any desired fastener.

Thus the surface mounting assembly 132 allows the device 102 to be mounted at one of a large number of potential locations inside the transformer housing 21. Furthermore, the present embodiment further provides a magnetic flux path, so as to reduce or eliminate interference with various components of the transformer 20. In particular, the surface mounting assembly 132 includes at least one flux return housing 150 that is attached, either discreetly or integrally, to the support surface 134 and/or an associated one of the magnets 136. As illustrated, the flux return housing 150 surrounds the outer periphery of the associated magnet 136. Thus, each magnet 136 is disposed in a flux return housing 150 that circumscribes the corresponding magnet 136 so as to provide a return path for magnetic flux. As a result, the magnetic flux from each magnet 136 flows through a magnetic flux path that flows through the magnet, and through the transformer housing wall and flux return housing 150. Therefore, when the device 102 is installed in the void 23 of the transformer 20, relatively little stray magnetic flux exists that could otherwise induce errors in the electronic device 102 or produce other unwanted effects.

The flux return housing 150 may be provided in a shape that generally conforms to the outer surface of the 136. Thus if the outer edge of the magnet 136 is a circle, a square, a rectangle, trapezoid, ellipse or any other shape, the housing 150 may be correspondingly shaped and have a slightly larger inner diameter or cross-sectional dimension than that of the magnet 136 in order to surround the outer periphery of the magnet. As illustrated, a gap 145 can separate the inner surface of the flux return housing 150 and the outer surface of the corresponding magnet 136. In one embodiment, the gap 145 is zero, such that the inner surface of the housing 150 can contact the outer surface of the magnet 136.

The flux return housing 150 further includes an inner wall 151 that is disposed between the magnet 136 and the housing 120. The flux return housing 150 can be attached to the electronic device by any apparatus known in the art such as adhesives, screws, or any other suitable apparatus. In accordance with the illustrated embodiment, each magnet 136 includes a centrally disposed bore 142 that extends through the magnet 136 from the outer end 139 to the inner end 137. A washer 140 can be disposed between the inner wall 151 of the flux return housing 150 and the support surface 134 of the housing 120, and another washer 140' can be placed on the outer surface of the inner wall 151 at a location inside the bore 142, such that the washers 140 and 140' are aligned. A screw or bolt 138 extends inwardly from the outer surface of the washer 140', through an opening in the inner wall 151, and into the housing 120, such that the screw head bears against the washer 140'.

A nut 153 can fasten onto the screw shaft inside the housing 120, such that the screw 138 fastens the flux return housing 150 to the support surface 134. The screws 138 can be metallic and the washers 140 can be made from rubber or other compliant material in accordance with the illustrated embodiment, though the screws 138 and washers 140 can be made of any suitable material known in the art. The magnets 136 can each be directly attached to the outer surface of the inner wall 151 via any suitable attachment mechanism, for example, an adhesive, tape, screws, pegs, nails, or the like. It should be appreciated that the magnets 136 can alternatively be attached to the flux return housing 150, directly or indirectly, in any desired manner. In this regard, it should be appreciated that the magnets 136 are indirectly attached to the support surface 134 of the housing 120. Alternatively, the magnets 136 can be directly or indirectly attached to the support surface 134 using any desired attachment mechanism.

The rubber washers 140 to help seal the screw connection to the measuring device 102 and thus keep contaminants such as water out of the interior of the device 102. Alternatively or additionally, a sealant can be applied around the periphery of the head of the screws 136 if desired to further prevent or reduce instances of contamination of the inside of the device 102. For example, sealant may be used around the heads of the screws 138. Furthermore, it should further be appreciated that the washers 140 can permit the position of the magnets 136 and flux return housing 144 to be slightly adjustable when mounting onto the transformer housing 21. The adjustment may, for instance, take the form of allowing the magnets 136 to tip and tilt, or allowing some compression against the washers 140. Such elements allow for variation on transformer housing surfaces to which the device 102 may be mounted.

In accordance with one embodiment, the flux return housing 150 may protrude from the support surface 134 of the electronic measuring device 102 a distance equal to that of the magnet 136, such that the outer end of the flux return housing 150 is substantially flush with the outer end 139 of the magnet 136. Accordingly, both the flux return housing 150 and the magnet 136 contact the housing 21, thereby providing the flux path as described above.

Figure 10A:
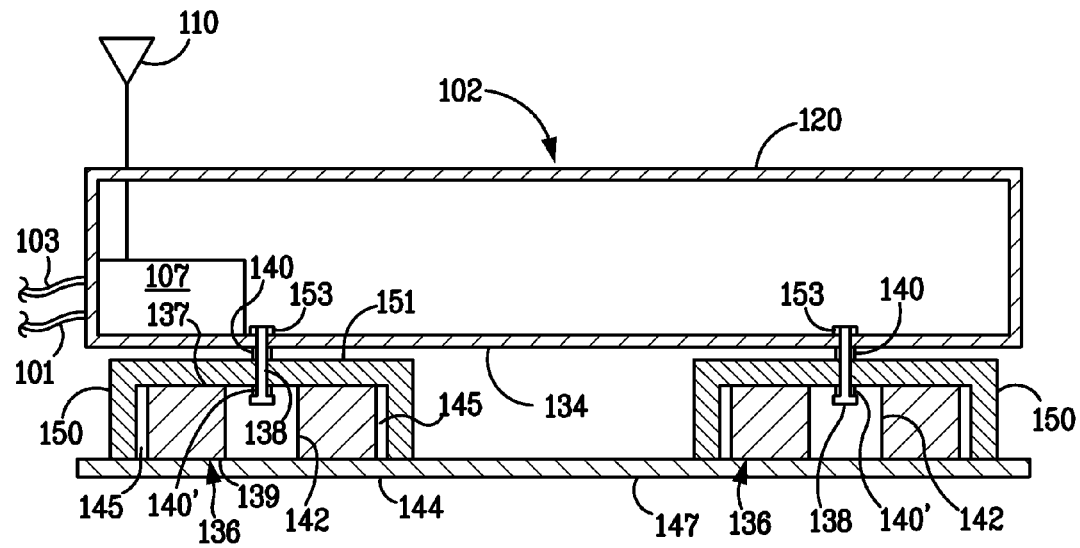
FIG. 10A is a schematic sectional side elevation view of the electronic measuring device illustrated in FIG. 7 attached to a keeper plate.
Figure 10B:
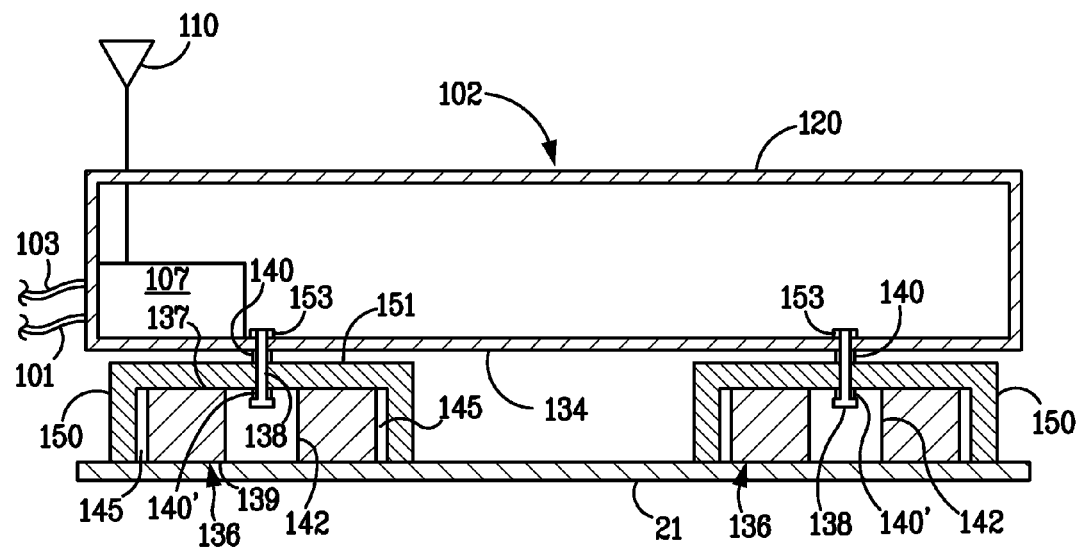
FIG. 10B is a schematic sectional side elevation view of the electronic measuring device illustrated in FIG. 7 mounted onto an interior transformer housing surface.

Referring now in particular to FIG. 10A, the surface mounting assembly 132 further includes one or more removable keeper plates 144, which can typically attach to the magnets 136 during transport or storage to provide tight paths for the magnetic flux and reduce stray flux. The keeper plate 144 can be removed prior to mounting the assembly 132 onto the inner surface of the transformer housing as shown in FIG. 10B. With continuing reference to FIG. 10A, each keeper plate 144 may be provided as any magnetically conductive material, such as steel. Each keeper plate 144 can be planar member so as to extend across the outer surface 139 of the corresponding magnet or magnets 136. In this regard, it should be appreciated that a single keeper plate 144 can be dimensioned so as to extend across all magnets 136 that are mounted onto the support surface 134. Alternatively, a plurality of keeper plates 44 can be provided, such that each keeper plate 44 is dimensioned slightly larger than the outer surface 139 of a corresponding individual magnet 136, and thus configured to cover the outer surface 139 of a single magnet 136.

The keeper plate 144 thus allow a magnetic flux path to flow through the magnets 136, and through the keeper plate 144 and the flux return housing 150. In this regard, the keeper plate 44 may be of any thickness suitable to create a flow path for the magnetic flux from the one or more magnets 144 that are covered by the keeper plate 144. The one or more keeper plates 144 may be of any shape, including a shape which matches the shape of the support surface 134 or a corresponding one or more of the magnets 136. Thus, the keeper plate 144 can be shaped as a circle, a square, a rectangle, ellipse, trapezoid, any other polygon or an amorphous shape.

While the surface mounting assembly 132 is particularly suitable to mount the electronic measuring device 102 onto a metallic transformer housing 21, the mounting assembly 132 is likewise configured to mount the measuring device 102 onto a transformer housing that may be made from a non metallic (and thus non-magnetic) material. In particular, the outer surface 147 of the keeper plate 144 may be configured to interface with the transformer housing 21. In this regard, the outer surface 147 may be covered with any suitable adhesive, such as double sided tape, glue, or any other material suitable to reliably one surface to another. In accordance with this embodiment, magnets 136 are magnetically attached to the inner surface of the keeper plate 144, so as to keep the electronic measuring device 102 mounted on the keeper plate 144, and the keeper plate 144 can be affixed to the transformer housing 21.

It should thus be appreciated that the electronic measuring device 102 includes a surface mounting assembly 132 that allows the device 102 to be mounted at any number of locations within a transformer housing, and can thus avoid interference with the cables, inputs and outputs, and other structure that can be disposed at unpredictable locations inside the housing. Stated another way, a method of determining the power of a first and second transformer includes mounting a first electrical measuring device 102 to the first transformer as described above, via the surface mounting assembly 132, at a first location of a transformer housing 21 whose terminal assembly or assemblies 32 and associated wiring are arranged in a first configuration, and mounting a second substantially identical or identical electrical measuring device 102, via the surface mounting assembly 132, at a second location of another transformer housing 21 whose terminal assembly or assemblies 32 and associated wiring are arranged in a second configuration that is different from the first configuration. For instance, the first configuration can be an ANSI Type 1 arrangement, and the second configuration can be in an ANSI Type 2 arrangement. The first and second locations of the first and second transformer housings can be different relative to their respective housing based on the different configurations of the terminal assembly or assemblies 32. Furthermore, the surface mounting assembly 132 may include a flux return housing that prevents magnetic flux from interfering with various transformer components.

While systems, assemblies, and methods have been described and illustrated with reference to specific embodiments, those skilled in the art will recognize that modification and variations may be made without departing from the principles described above and set forth in the following claims. Accordingly, reference should be made to the following claims as describing the scope of the present invention.

The invention claimed is:

1. A remote power measurement assembly configured to calculate power output of a pad mount low voltage distribution power transformer of the type including a transformer housing defining an interior void, and at least one terminal assembly that includes an output stud extending into a wiring terminal, and a plurality of output load wires connected to the wiring terminal, the remote power measurement assembly comprising:
   a current sensor configured to sense a current level of the current carrying member, and outputs a signal reflecting the sensed current level; and
   an electronic measuring device operatively coupled to the current sensor so as to receive the output signal, such that the electronic measuring device is movable with respect to the current sensor, the electronic measuring device including a measuring device housing, and a surface mounting assembly that includes at least one magnet coupled to the measuring device housing, wherein the magnet is configured to magnetically mount the measuring device housing onto an inner surface of the transformer housing.

2. The remote power measurement assembly as recited in claim 1, wherein the surface mounting assembly further comprises a flux return housing attached to the measuring device housing at a location adjacent the magnet, such that the flux return housing, the magnet, and the transformer housing define a magnetic flux path.

3. The remote power measurement assembly as recited in claim 2, wherein the flux return housing is spaced from the magnet.

4. The remote power measurement assembly as recited in claim 2, wherein the flux return housing is in contact with the magnet.

5. The remote power measurement assembly as recited in claim 2, wherein the flux return housing and the magnet each define an outer surface configured to magnetically engage the inner surface of the transformer housing.

6. The remote power measurement assembly as recited in claim 1, wherein the magnet defines an outer surface configured to magnetically engage the inner surface of the transformer housing, and the surface mounting assembly further comprises a keeper plate extending over the outer surface of the magnet before the magnet is mounted onto the inner surface of the transformer housing.

7. The remote power measurement assembly as recited in claim 6, wherein the keeper plate is magnetically conductive.

8. The remote power measurement assembly as recited in claim 7, wherein the keeper plate defines an outer surface that is configured to carry an adhesive that is configured to attach to the inner surface of the transformer housing.

9. The remote power measurement assembly as recited in claim 1, wherein a wire carries an output signal from the current sensor to the electronic measuring device.

10. The remote power measurement assembly as recited in claim 1, wherein the electronic measuring device further comprises a radio transmitter configured to transmit power level signals at 900 MHz.

11. The remote power measurement assembly as recited in claim 1, wherein the current sensor comprises an insulating body defining a slot extending into the body, wherein the slot receives the current carrying member when the sensor is mounted onto the current carrying member.

12. A remote power measurement assembly configured to calculate power output of a pad mount low voltage distribution power transformer of the type including a transformer housing defining an interior void, and at least one terminal assembly that includes an output stud extending into a wiring terminal, and a plurality of wires connected to the wiring terminal, the remote power measurement assembly comprising:
   a current sensor configured to be mounted onto a current carrying member of the terminal assembly, wherein the current sensor senses a current level of the current carrying member, and outputs a signal reflecting the sensed current level; and
   an electronic measuring device operatively coupled to the current sensor so as to receive the output signal, the electronic measuring device including:
      at least one magnet coupled to a support surface of the measuring device housing an configured to be mounted onto an inner surface of the transformer housing;
      a magnetically conductive flux return housing attached to the support surface at a location adjacent the magnet, so as to define a magnetic flux path that extends through the magnet, the transformer housing, and the flux return housing.

13. A remote power measurement assembly as recited in claim 12, wherein the flux return housing is spaced from the magnet.

14. The remote power measurement assembly as recited in claim 12, wherein the flux return housing is in contact with the magnet.

15. The remote power measurement assembly as recited in claim 12, wherein the magnet defines an outer surface that is attached to the inner surface of the transformer housing and the flux return housing is substantially flush with the outer surface of the magnet.

16. The remote power measurement assembly as recited in claim 12, wherein the electronic measuring device is movable with respect to the current sensor so as to be positionable at different locations on the transformer housing.

17. The remote power measurement assembly as recited in claim 12, wherein the current sensor is connected to electronic measuring device via an output wire that carries an output signal from the current sensor to the electronic measuring device.

18. A method of determining a power output of a first and second transformer, wherein the first transformer includes a first transformer housing that defines an internal void that houses at least one terminal assembly and associated wiring arranged in a first configuration, and the second transformer includes a second transformer housing that defines an internal void that houses at least one terminal assembly and associated wiring arranged in a second configuration, wherein the second configuration is different than the first configuration, the method comprising the steps of:

providing a first electrical measuring device including a current sensor, an electronic measuring device configured to receive an output from the current sensor, and a wire connecting the current sensor to the electronic measuring device, wherein the first electronic measuring device includes a support surface that carries at least one magnet;

mounting the magnet of the first electronic measuring device onto the first transformer housing inside the internal void of the first transformer housing at a first location;

providing a second electrical measuring device that is substantially identical to the first electrical measuring device, the second electrical measuring device including a current sensor, an electronic measuring device configured to receive an output from the current sensor, and a wire connecting the current sensor to the electronic measuring device, wherein the second electronic measuring device includes a support surface that carries at least one magnet; and mounting the magnet of the second electronic measuring device onto the second transformer housing inside the internal void of the second transformer housing at a second location that is different than the first location.

19. The method as recited in claim 18, further comprising the step of transmitting signals from each electrical measuring device through the respective transformer housing at a frequency of 900 MH.

20. The method as recited in claim 18, further comprising the step of removing keeper plates from magnets prior to mounting the magnets onto the respective transformer housing.

* * * * *

UNITED STATES PATENT AND TRADEMARK OFFICE
CERTIFICATE OF CORRECTION

PATENT NO. : 8,248,059 B2  Page 1 of 1
APPLICATION NO. : 12/696336
DATED : August 21, 2012
INVENTOR(S) : Cooper It is certified that error appears in the above-identified patent and that said Letters Patent is hereby corrected as shown below:

At COL. 14, [claim 12] line 34, delete "an" and substitute therefor --and--

Signed and Sealed this
Thirteenth Day of November, 2012

David J. Kappos
*Director of the United States Patent and Trademark Office*